United States Patent
Posseme

(10) Patent No.: US 11,244,868 B2
(45) Date of Patent: Feb. 8, 2022

(54) METHOD FOR MANUFACTURING MICROELECTRONIC COMPONENTS

(71) Applicant: COMMISSARIAT A L'ENERGIE ATOMIQUE ET AUX ENERGIES ALTERNATIVES, Paris (FR)

(72) Inventor: Nicolas Posseme, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/999,642

(22) Filed: Aug. 21, 2020

(65) Prior Publication Data

US 2021/0057283 A1  Feb. 25, 2021

(30) Foreign Application Priority Data

Aug. 23, 2019  (FR) .................... 19 09377

(51) Int. Cl.
*H01L 21/8234*  (2006.01)
*H01L 21/265*  (2006.01)
(Continued)

(52) U.S. Cl.
CPC .... *H01L 21/823468* (2013.01); *H01L 21/265* (2013.01); *H01L 21/30604* (2013.01); *H01L 21/76224* (2013.01)

(58) Field of Classification Search
CPC ........... H01L 21/265; H01L 21/823468; H01L 21/30604; H01L 21/76224
See application file for complete search history.

(56) References Cited

U.S. PATENT DOCUMENTS

| RE45,060 E | 8/2014 | Teo et al. |
|---|---|---|
| 2003/0136332 A1 | 7/2003 | Krishnaraj et al. |

(Continued)

FOREIGN PATENT DOCUMENTS

EP  3 246 953 A1  11/2017

OTHER PUBLICATIONS

French Preliminary Search Report dated Apr. 22, 2020 in French Application 19 09377 filed Aug. 23, 2019 (with English Translation of Categories of Cited Documents and Written Opinion), 10 pages.

*Primary Examiner* — Zandra V Smith
*Assistant Examiner* — Andre C Stevenson
(74) *Attorney, Agent, or Firm* — Oblon, McClelland, Maier & Neustadt, L.L.P.

(57) ABSTRACT

A method for producing a component is provided, a base of which is formed by transistors on a substrate, including: forming a gate area, spacers, and a protective coating partly covering the spacers and a sidewall portion of a cavity without covering a top face of the gate area and a base portion of the cavity; forming a contact module, the gate located in beneath the module; and removing part of the coating with an isotropic light-ion implantation to form modified superficial parts in a thickness, respectively, of the contact module, of the coating, and of the base portion, and with an application of a plasma to: etch the modified superficial parts to only preserve, in the coating, a residual part of the coating, and to form a silicon oxide-based film on exposed surfaces, respectively, of the contact module, of the cavity, and of the coating.

17 Claims, 4 Drawing Sheets

(51) Int. Cl.
    *H01L 21/306*     (2006.01)
    *H01L 21/762*     (2006.01)

(56) References Cited

U.S. PATENT DOCUMENTS

| | | |
|---|---|---|
| 2005/0124166 A1 | 6/2005 | Krishnaraj et al. |
| 2012/0018797 A1* | 1/2012 | Yu .................... H01L 29/66833 |
| | | 257/324 |
| 2012/0025318 A1 | 2/2012 | Richter et al. |
| 2012/0025323 A1 | 2/2012 | Teo et al. |
| 2013/0029482 A1 | 1/2013 | Teo et al. |
| 2014/0017886 A1 | 1/2014 | Teo et al. |
| 2014/0179107 A1 | 6/2014 | Nowling |
| 2014/0299937 A1 | 10/2014 | Teo et al. |
| 2017/0338157 A1 | 11/2017 | Posseme et al. |
| 2019/0312117 A1* | 10/2019 | Qi .................... H01L 21/30604 |

* cited by examiner

A-A

A-A

A-A

METHOD FOR MANUFACTURING MICROELECTRONIC COMPONENTS

TECHNICAL FIELD

The present invention relates to the field of manufacturing microelectronic components. It advantageously applies to the manufacture of transistor-based components, these components allowing, for example, for the formation of CMOS (Complementary Metal Oxide Semiconductor) circuits or volatile memories such as Flash memories or non-volatile memories such as SRAM (Static Random Access Memory), however it is not limited thereto.

PRIOR ART

In the field considered hereinabove, technologies are known for manufacturing transistors based on substrates of various technologies. This can involve SOI-type substrates (acronym for Silicon On Insulator) comprising an underlying semiconductor film (often silicon), overlaid with a so-called BOX film, then with a semiconductor surface film, such as monocrystalline silicon. SOI substrates have been refined to give FDSOI technology (Fully Depleted Silicon On Insulator) which corresponds to a support of the type made of a superficial film of a fully depleted silicon on insulator wafer.

The bulk type is a simple type of substrate. These substrates generally comprise a semiconductor material base, typically made of silicon, and electrically-insulating areas, typically made of silicon dioxide. The electrically-insulating areas are exposed at one of the faces of the substrate and delimit exposed areas made of the semiconductor material. Thus, the electrically-insulating areas act as an electrical separation between different areas of the semiconductor material, also referred to as active areas. These active areas are where transistors are manufactured. The electrically-insulating areas are in particular known to be manufactured by producing lateral isolation trenches known as STI (Shallow Trench Isolation).

In this context, FIG. 1 shows an overhead view of an outline of a substrate 1 provided, on a first face 10, with exposed areas comprising active areas 11 and electrically-insulating areas 12. Transistor gates 21 can be formed on the basis of bars oriented perpendicularly to the longitudinal orientation of the active areas 11.

Moreover, it is known that the production of CMOS components can require the addition of films for producing the stress (compressive stress or respectively tensile stress) for increasing the performance levels of the devices, in particular of field-effect transistors (of the P type or respectively of the N type). These stress films are also referred to as stress liners or CESLs (Contact Etch Stop Liners). The effectiveness thereof depends on the thickness of the film, which often has a silicon nitride base. However, the deposition thereof generates filling defects which result in the short-circuiting of neighbouring microelectronic components.

FIGS. 2 to 7B explain these defects. They show sectional views along the A-A line in FIG. 1, showing the impact of the manufacturing steps on the electrically-insulating areas. They summarise the successive phases for manufacturing components.

In FIG. 2, gates 21 (generally made of polysilicon with an underlying electrically-insulating film, typically an oxide film, not shown in the figures) have been manufactured on the base of the substrate 1. Moreover, at this stage, spacers 22 have been formed by deposition of spacer films, typically made of silicon nitride, and by etching, using well-known photolithography and etching techniques. A hard mask 23 lies over the gate 21 of the transistors during this step, which further includes the manufacture of source/drain areas on portions of the active area where the transistor is present, these portions being adjacent to the gate of the transistor. This manufacture involves successive dopings, of the N type and of the P type, to form the two transistor natures in CMOS technologies. During these steps, the electrically-insulating area 12 is affected such that a consumed area 13 appears at the surface thereof, in the form of concave portions. This consumed area 13 is hereafter referred to as a cavity.

Similarly, the step of removing the hard mask 23 presented in FIG. 3 worsens the consumption of the material of the electrically-insulating area 12 at the cavity 13. The material forming the electrically-insulating area 12 is hereafter referred to as a dielectric material.

A subsequent step can involve the deposition of a protective coating on the gates, in the form of a film 14, for example made of silicon nitride, as shown in FIG. 4.

As shown in FIG. 5, this protection must then be selectively removed on the horizontal parts to clear the top of the gate and the surface of the insulating areas, with openings 41 in the protective film 14, while preserving a protective coating on the spacers 22. This step results in additional consumption of the dielectric material.

Subsequent steps are presented in FIG. 6 with silicidation of a portion 25 of the top of the gate 21. This silicided portion 25 reduces the contact resistance; it is also referred to as a contact module. It can be made of nickel silicide.

It should be noted that these steps generally include one or more heat treatments, as well as cleaning phases which can also damage the integrity of the dielectric material.

Finally, a mechanically stressing layer 15 can be deposited. Given the unwanted consumption of the dielectric material of the area 12 between two adjacent transistors, the aspect ratio of the cavities 13 is increased, which is detrimental to the reliable filling of the spaces between two adjacent transistors. FIG. 7A reveals that voids 72 can remain within the mechanically stressing layer 15. Unfortunately, these residual voids 72 cannot be filled with other films on top of the mechanically stressing layer 15, such as an electrically-insulating top film generally made of silicon dioxide. This filling defect is even more critical if the transistor stage thus formed is embedded in the middle of line film of a comprehensive microelectronic device.

The residual voids 72 thus formed typically extend along the transverse bars 211 of gates, from one active area 11 to the other. This can be detrimental when one of these voids 72 is opened during a subsequent formation of the electrical contacts, in particular when an alignment issue arises for these contacts. In such a case, when depositing the conductive material (for example tungsten), in particular by chemical vapour deposition, the void 72 thus opened is filled with the conductive material and creates a short-circuit between two contact areas of two adjacent active areas which are not intended to be electrically connected. FIG. 7B diagrammatically shows two contact elements 8 present on adjacent active areas 11 and connected by a short-circuit area 81 involuntarily formed by way of a residual void linked to a defect in filling the mechanically stressing layer 15.

In view of these drawbacks, a large space must currently be preserved between two adjacent transistors, which generally involves limiting the density with which the transistors are implanted on the substrate. Even without considering depositing a stress film, there is also the need to optimise the space between two adjacent transistors.

There is thus a need to improve the current techniques employed for manufacturing microelectronic components.

The present invention in particular relates to a method for producing a transistor-based component that eliminates or limits the appearance of residual voids in the electrically-insulating areas.

SUMMARY

One aspect relates to a method for producing a component, the base whereof is formed by a plurality of transistors, on a substrate comprising at least one active area and an electrically-insulating area, each transistor of the plurality of transistors comprising a gate, spacers on the sidewalls of the gate and a contact module on a top face of the gate, the at least one electrically-insulating area comprising at least one concave-shaped cavity between a spacer of a first transistor of the plurality of transistors and a spacer of a second transistor of the plurality of transistors, said first transistor and second transistor being adjacent.

The method comprises:
forming a gate area of the transistors,
forming the spacers,
forming a protective coating configured so as to at least partially cover the spacers and a sidewall portion of the cavities, without covering a top face of the gate area and a base portion of the cavities (for example by having made a plasma-etched opening in this location).
forming the contact module in a top portion of the gate area from the top face, the gate being located in a portion of the gate area lying beneath the contact module.

Advantageously, the method comprises, after the contact module has been formed, removing at least one part of the protective coating, with:
an isotropic light-ion implantation configured so as to form modified superficial parts in the thickness, respectively, of the contact module, of the protective coating and of the base portion of the cavity;
an application of a plasma comprising at least one mixture of gaseous components, the application of a plasma being configured so as to:
etch the modified superficial part of the protective coating so as to only preserve, in the protective coating, a residual part of the protective coating;
form a silicon oxide-based film on the exposed surfaces, respectively, of the contact module, of the cavity and of the protective coating, and so that the film of a silicon oxide is thicker on the exposed surface of the contact module and on that of the cavity than on the exposed surface of the protective coating.

This method thus provides a solution for reducing the aspect ratio of the parts of the electrically-insulating area situated between two adjacent transistors, by removing lateral parts of the protective coating. By widening the space between the transistors, in particular at the concave cavities formed in the electrically-insulating area by the successive manufacturing steps, the risk of voids forming during the deposition of the mechanically stressing layer is reduced or eliminated.

A subsequent operation of filling, in particular by the stress liner, the spaces between the gates is thus improved. The appearance of residual voids is prevented.

According to an advantageous aspect, the implantation phase renders the modified portion of the protective coating highly sensitive to the subsequent etching, during the application of the plasma. The isotropic nature of the implantation ensures that the protective coating is as modified as the horizontal parts of the device.

According to another advantageous aspect, the phase of applying a plasma produces a silicon oxide film which more preferentially develops on the horizontal parts, in particular on the exposed surface of the contact module and of the bottom of the cavity. These areas are thus quickly protected, since they are covered with a film that can be considered to resemble a passivation film. At the same time, the vertical parts, in this case essentially at the protective coating, are not subjected to the creation of a silicon oxide film, or less so; as a result, these parts are effectively etched by the one or more plasma species etching the material of the protective coating, typically silicon nitride.

It is understood that the protection of the horizontal parts procures a very high degree of selectivity of the etching when applying the plasma. Moreover, even if the latter is potentially highly anisotropic, this does not affect the effectiveness thereof in targeting the vertical parts, i.e. the protective coating to be removed.

In one advantageous but non-limiting embodiment, the method subsequently comprises:
an additional isotropic light-ion implantation, configured so as to remove the silicon oxide-based film from the exposed surface of the protective coating while preserving at least part of the thickness of the silicon oxide-based film on the exposed surface of the contact module and on that of the cavity, and configured so as to form a new modified superficial part of the exposed surface of the residual part of the protective coating;
an additional application of the plasma, configured so as to etch the new modified superficial part of the residual part of the protective coating, in a selective manner relative to the modified parts of the silicon oxide film, respectively, on the exposed surface of the contact module and on that of the cavity.

According to a non-limiting, advantageous aspect, at least one isotropic implantation and plasma application cycle is additionally carried out so as to remove all or as much as possible of the protective coating, step by step. This reiteration ensures gradual and precise lateral consumption of the material of the protective coating. For example, this allows it to be removed without consuming, or while consuming very little of the material of the spacers.

Embodiments further relates to the components obtained by the disclosed aspects of the method.

BRIEF DESCRIPTION OF THE FIGURES

The aims, purposes, characteristics and advantages will be better understood upon reading the detailed description of one embodiment, which is illustrated by means of the following accompanying drawings, in which.

Figure 1:
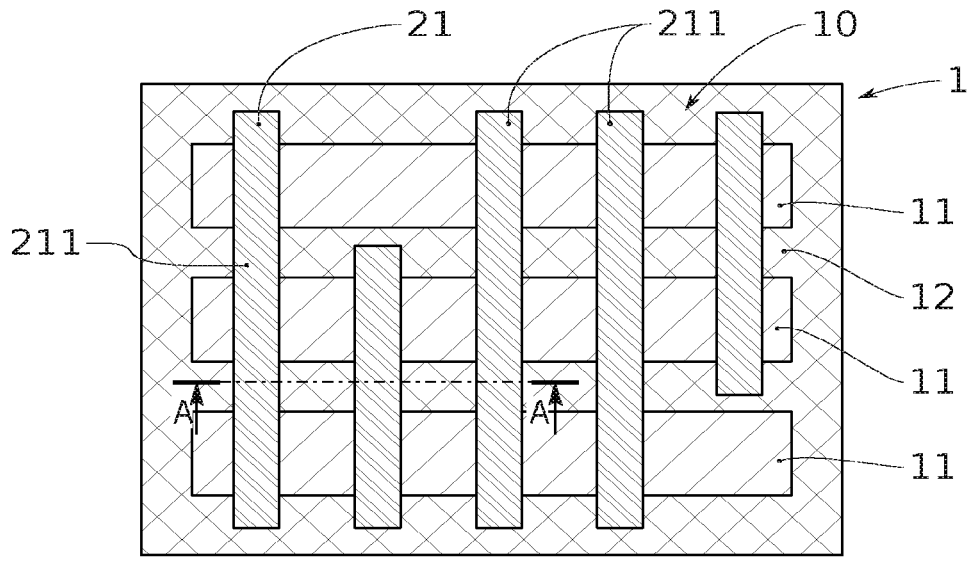
FIG. 1 diagrammatically shows an overhead view of a substrate comprising active areas and adjacent electrically-insulating areas, on which transistor gates are disposed.
Figure 2:
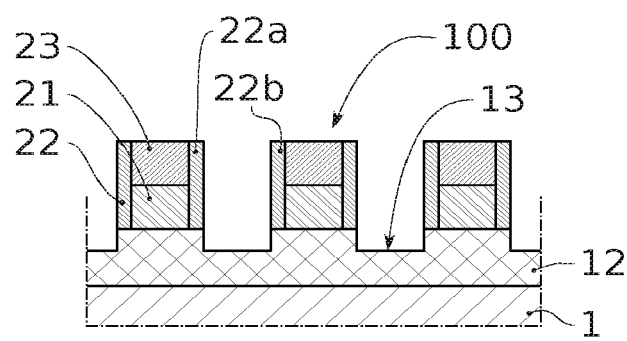
FIG. 2 diagrammatically shows a cross-sectional view of a step of forming gate spacers according to the prior art.
Figure 3:
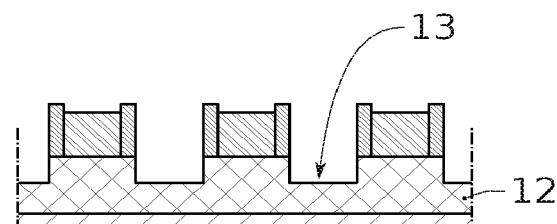
FIG. 3 diagrammatically shows a cross-sectional view of a step of removing the hard mask, occurring after that in FIG. 2, according to the prior art.

The drawings are provided by way of example and are not intended to limit the scope of the invention. They constitute diagrammatic views intended to ease the understanding of the invention and are not necessarily to the scale of practical applications. In particular, the relative thicknesses of the different films are not representative of reality.

DETAILED DESCRIPTION

Before giving a detailed description of the embodiments, it should be recalled that the method can in particular comprise the optional features given hereinbelow, which can be used in combination with one another or alternately:

- at least one additional cycle for performing the additional isotropic implantation and additional application is carried out;
- a plasma is used, wherein the mixture of gaseous components comprises at least one first gaseous component and one second gaseous component, and the first gaseous component is configured so as to etch the modified superficial part of the protective coating so as to only preserve, in the protective coating, a residual part of the protective coating, and wherein the second gaseous component is configured so as to etch at least one part of the residual part of the protective coating;
- the second gaseous component comprises at least one fluorocarbon species;
- the at least one fluorocarbon species comprises at least one hydrofluorocarbon species;
- the first gaseous component comprises SiCl4 and/or SiF4;
- the mixture of gaseous components further comprises dioxygen;
- after removing at least one part of the protective coating, a mechanically stressing layer is formed for the transistors;
- the method is configured so as to entirely remove the protective coating before the formation of the mechanically stressing layer;
- the light ions comprise species selected from hydrogen- and/or helium-based ions;
- isotropic implantation is carried out by applying a plasma comprising the light ions at a pressure of greater than or equal to 100 Millitorr, i.e. 0.1×(101325/760)Pa, at a temperature of less than or equal to 100° C.;
- the duration of the isotropic implantation is less than or equal to 30 seconds, and preferably less than 10 seconds;
- the protective coating is made with a silicon nitride base;
- the contact module is made of a metal silicide;
- the electrically-insulating area (12) is made of silicon dioxide;
- after removing at least one part of the protective coating and before forming the mechanically stressing layer, etching is carried out so as to remove the silicon oxide film;
- isotropic implantation, plasma application, additional isotropic implantation and additional plasma application are carried out in the same reactor.

It is specified that, within the scope of the present invention, the terms "on", "overlying", "covers" or "underlying" or the equivalents thereof do not necessarily mean "in contact with". Thus, for example, the deposition of a first film on a second film does not necessarily mean that the two films are directly in contact with one another, but rather means that the first film covers at least partially the second film while being either directly in contact therewith, or while being separated therefrom by at least one other film or at least one other element.

Moreover, a film can be constituted by a plurality of sub-films made of the same material or made of different materials.

A substrate, a film, or a device having a material M base is understood to mean a substrate, a film, or a device comprising this material M only or comprising this material M and optionally other materials, for example alloying elements, impurities or doping elements. Thus, a spacer having a silicon nitride SiN base can, for example, comprise non-stoichiometric silicon nitride (SiN) or stoichiometric silicon nitride (Si3N4), or even a silicon oxynitride (SiON). The silicon oxide-based film formed by the plasma can comprise at least 50% of this oxide, or simply be a film made of this oxide.

A component, device or element of a microelectronic device is understood to mean any type of element made using microelectronic means. In addition to devices intended for purely electronic purposes, these devices in particular include micromechanical or electromechanical devices (MEMS, NEMS, etc.) as well as optical or optoelectronic devices (MOEMS, etc.).

Several embodiments implementing successive steps of the manufacturing method are described hereinbelow. Unless specified otherwise, the adjective "successive" does not necessarily imply that the steps immediately follow on from one another, although this is generally preferred, and they can be separated by intermediate steps. Moreover, the term "step" is understood to mean the performance of a part of the method, and can denote a set of sub-steps.

The word "dielectric" qualifies a material whose electric conductivity is low enough in the given application to act as an insulator. In the present invention, a dielectric material preferably has a dielectric constant of less than 7. The STI and the spacers are typically made of a dielectric material.

The terms "gate pattern", "gate stack", "gate" are used synonymously.

In the present patent application, a cavity 13 corresponds to a void formed within the electrically-insulating area 12, this void being open at the surface of said electrically-insulating area 12, this void further extending between two spacers 22 of two adjacent respective transistors opposite said spacers 22. The hollow formed by the cavity 13 extends relative to a plane aligned with the interface between the insulation area and the gate.

The present patent application preferentially employs the term thickness for a film, height for a device (for example a transistor or gate) and depth for a cavity or an etch. The thickness is considered in a direction normal to the main plane of extension of the film, the height and the depth are considered in a direction normal to the base plane of the substrate. In the case where the film extends in a plurality of directions, in particular during phases for producing spacers or a protective coating, the orientation of the thickness can vary; on the sidewalls of the gate, for example, the thickness of the spacers or of the protective coating is generally parallel to the plane of the substrate.

In general, however without being limiting, a spacer forms a ring around the gate, with a closed contour; this can be referred to as a single spacer around the gate; however, the sectional views and the preferred directions of the gates also require the mention of pairs of spacers (or first and second spacers), which terminology is used herein.

The terms "substantially", "about", and "in the order of" mean "to within 10%" or, when referring to an angular orientation, "to within 10°". Thus, a direction substantially normal to a plane means a direction having an angle of 90±10° relative to the plane.

In order to determine the geometry of the transistors and the disposition of the different films, electron microscopy analyses can be carried out, in particular Scanning Electron Microscopy (SEM) or Transmission Electron Microscopy (TEM).

The chemical compositions of the different films or regions can be determined using the well-known EDX or X-EDS method, acronym for "energy dispersive x-ray spectroscopy".

This method is well suited for analysing the composition of portions of small dimensions such as cavities filled with the filling material. It can be implemented on metallurgical cuts in SEM or TEM.

These techniques in particular allow it to be determined whether residual voids remain in the insulation trenches and where relevant, the dimensions thereof.

The size of the residual voids and/or of the cavities filled with a filling material are characteristic of the implementation of the method. They can thus be an indication for the implementation of the method according to the invention.

The method for manufacturing transistors will now be described in detail according to one indicative embodiment.

The method comprises a part of conventional transistor manufacturing steps intended to form, on a substrate, for each of the transistors, a pattern or a gate area 100 flanked by spacers 22. The steps in FIGS. 1 to 6 can in particular be carried out. Reference can be made thereto for the steps described immediately hereafter.

The substrate 1 can comprise a so-called bulk part, active areas 11 made of semiconductor material, and insulating areas 12 made of dielectric material.

The substrate can also be of the semiconductor on insulator type, for example a silicon on insulator (SOI) substrate or a germanium on insulator (GeOI) substrate.

In any case, the transistors are formed on active areas 11 and are electrically insulated by insulating areas 12, typically STI (shallow trench isolation)-type trenches generally having a silicon oxide base.

The gate pattern 100 typically comprises a gate 21 and a hard mask 23 made of nitride, and typically silicon nitride (SiN). It can have a width referred to as a critical dimension that lies in the range 10 nm to 100 nm and preferably less than or equal to 50 nm.

The gate pattern can have a height in the order of a few tens of nanometres. The gate 21 typically has a height of less than or equal to 100 nm, for example approximately equal to 50 nm. The height of the hard mask 23 generally lies in the range 40 to 80 nanometres.

Two neighbouring gate patterns are separated by a pitch "p" that is typically less than or equal to 120 nm.

They can extend in directions transverse to the main directions of extension of the active area 11 and STI area 12 (FIG. 1). In particular, the same gate pattern 100 can alternately overlie one or more active areas 11 and one or more adjacent trenches STI 12.

Spacers 22 are formed along the sidewalls of this gate pattern 1. The sidewalls of the gate patterns extend along planes that are substantially normal to the base plane of the substrate.

In a known manner, the formation of these spacers 22 generally comprises a conformal deposition of a film of SiN on and between the gate patterns 1, followed by an anisotropic etching of the SiN, in a direction substantially parallel to the sidewalls of the gate patterns.

The deposition can typically take place by PEALD, so as to form a film of SiN having a thickness of less than or equal to 15 nm, for example in the range 6 nm to 15 nm, preferably in the range 8 nm to 12 nm.

Alternatively to the SiN, a dielectric material of the Low-k type (having a dielectric constant k<7) can be used to form the spacers 22. For example, this material can be SiBCN or SiCO, however is not limited thereto. The "SiN film" to which reference is made for clarity purposes can thus be understood to be "the film made of a dielectric material of the low-k type used to form the spacers 22".

The anisotropic etching is configured such that it consumes the portions of the SiN film located at the tip of the gate patterns 100 and between the gate patterns 100, over a part of the areas 12. It can take place using plasma, for example on the basis of fluorocarbon-type chemistry, in an inductively coupled plasma (ICP) reactor.

The form factor of the gate patterns 100 generally induces faster consumption of the film portions at the base of the gate patterns, on the substrate, compared to the film portions at the tip of the gate patterns.

This results in an over-etching phenomenon at the exposed areas of the substrate, in particular at the exposed areas of the STI 12.

Cavities 13 are thus formed at the surface of the exposed STI trenches 12.

During subsequent conventional manufacturing steps (in particular the removal of the hard mask 23, doping by implantation of the active areas to manufacture source/drain structures, and optional epitaxial growths at the active areas, for example in order to manufacture raised source/drain or RSD structures), these cavities 13 can develop and the depth thereof can increase. Subsequent steps can comprise high-temperature anneals.

In particular, a homogenising or activating anneal for the dopants implanted during the second ion implantation, often referred to as "spike anneal", can be carried out.

Figure 4:
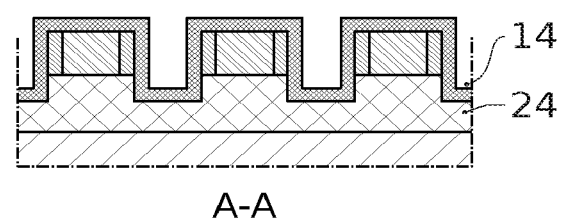
FIG. 4 diagrammatically shows a cross-sectional view of a step of depositing a protective film, occurring after that in FIG. 3 according to the prior art.
Figure 5:
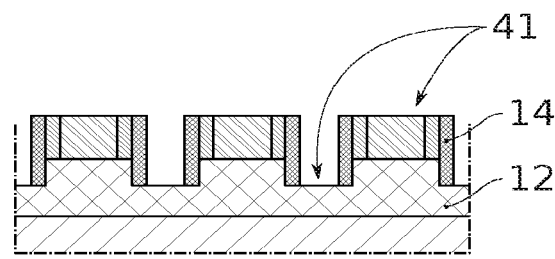
FIG. 5 diagrammatically shows a cross-sectional view of an anisotropic etching step, occurring after that in FIG. 4, according to the prior art.

As shown in FIG. 4, a protective film, preferably made of SiN, is deposited then etched in an anisotropic manner to obtain the outcome in FIG. 5. Lateral portions of the protective film are thus preserved on the sidewalls of the first spacers 22 to form a protective coating 24. The latter preferentially extends over the entire exposed surface of the spacers 22.

Figure 6:
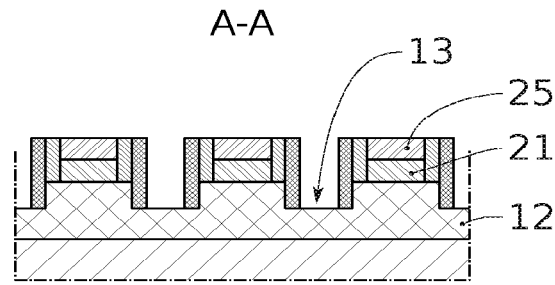
FIG. 6 diagrammatically shows a cross-sectional view of a silicidation step, occurring after that in FIG. 5, according to the prior art.
Figure 7A:
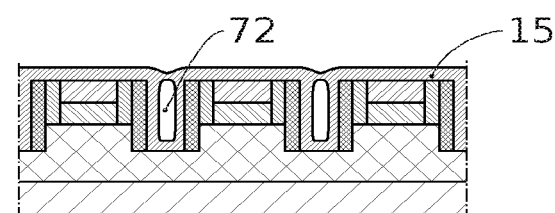
FIG. 7A diagrammatically shows a cross-sectional view of a step of forming a mechanically stressing layer, occurring after that in FIG. 6 according to the prior art.
Figure 7B:
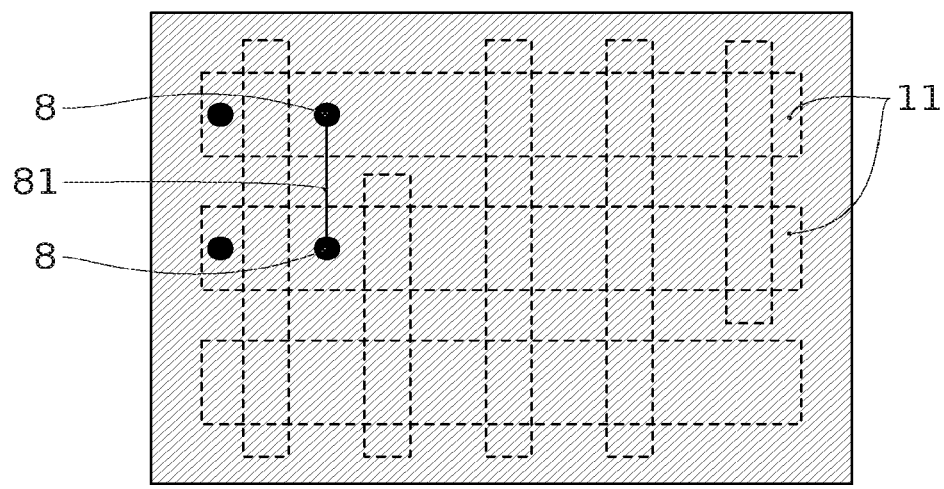
FIG. 7B diagrammatically shows an overhead view of a short-circuit between two electrical contacts.

As shown in FIG. 6, a step of siliciding a portion 25 of the gate area can also be carried out.

This step comprises the deposition of a metal, for example nickel (Ni) on the tip of the gates 21, and a plurality of thermal anneals aiming in particular to homogenise the metal in the gate (homogenising anneal) to form a silicide (NiSi or NiPtSi) and to passivate the electrically active defects (DSA or Dynamic Surface Anneal-type activating anneal). The result is a contact module 25 limiting electrical resistivity.

Figure 8:
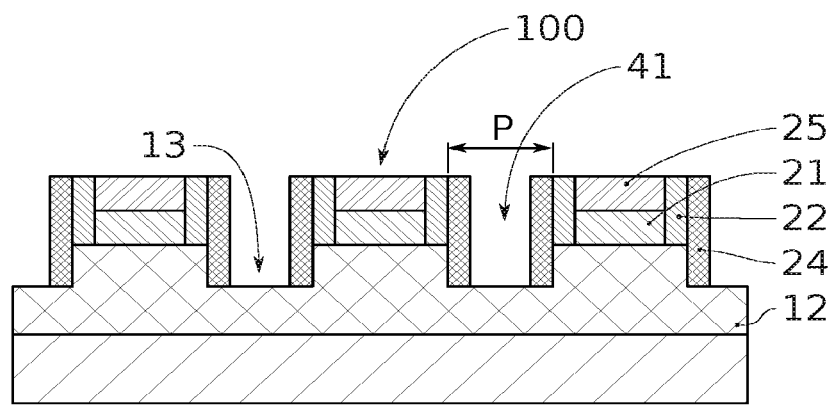
FIG. 8 shows an intermediate situation during the manufacture of the transistor component, with the presence of a protective coating.

FIG. 8 shows a configuration of the component at this stage, in which configuration the protective coating 24 occupies a non-negligible lateral space, extending laterally from the spacers 22 and covering the wall of the cavities 13 formed during the previous steps. The interstitial space between two adjacent transistors is thus reduced by this protective film, and the aspect ratio of this area, in particular at the bottom of the cavity 13, is increased, which is detrimental for subsequent film deposition steps.

In this context, the present invention seeks to reduce the lateral extension of the protective coating 24, or even to eliminate same.

Figure 9:
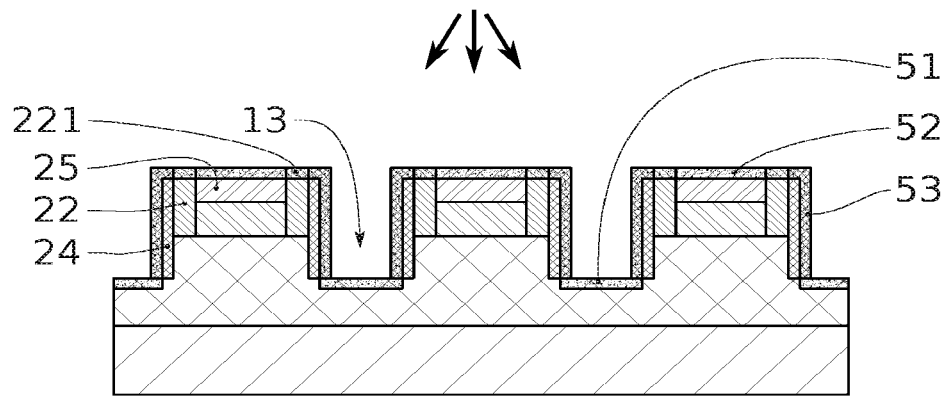
FIG. 9 shows a step of the method partially modifying the exposed materials.

According to one embodiment, the method of the invention comprises an implantation step for forming modified superficial parts of the exposed surfaces. FIG. 9 shows such a modification, in particular with a modified part 51 of the base portion (formed by an exposed surface of the material of the electrically-insulating area 12), of the cavity 13, a modified part 52 of the contact module 25 and a modified part 53 of the protective coating 24. In a minor way, the exposed edge 221 on the top face of the spacers 22 can also be modified.

Preferably, this implantation is carried out with light ions, i.e. ions that have low atomic numbers, preferably equal to one or two. For this purpose, the preferred species are hydrogen- and helium-based. This can be dihydrogen and/or helium or a mixture thereof, or even other compounds comprising hydrogen and/or helium, such as HBr or $NH_3$.

It is ensured that this implantation phase is isotropic so as to produce a modification over an equivalent or equal thickness on both the horizontal parts and on the vertical parts. In this context, various types of plasma etching reactors can be used, and in particular the "ICP" (inductively coupled plasma) type, or even the "CCP" (capacitively coupled plasma) type. Moreover, plasmas can be used by immersion.

One example of the parameters that can in particular be used in the context of an ICP reactor is given hereafter:
pressure: greater than or equal to 100 Millitorr, i.e. $0.1\times(101325/760)$Pa;
temperature: greater than or equal to 100° C.;
chemistry: $H_2$.

The operation time is relatively short so as to modify a low thickness. This time can be configured such that the modified thickness is less than or equal to 5 nm, preferably less than or equal to 3 nm. Alternatively or in combination, the time of this operation can be less than or equal to 30 seconds and/or greater than or equal to 5 seconds, and preferably less than or equal to 10 seconds and/or greater than or equal to 5 seconds.

The power of the source can lie in the range 100 to 2000 W, and is for example 500 W and/or the bias power can lie in the range 20 to 2000 W, and is for example 250 W. In terms of flow rate, a hydrogen flow of 200 sccm (standard cubic centimetres per minute) can be used.

On the base of these superficial parts modified by the implantation, a plasma comprising a mixture of gaseous components is applied.

In one preferred embodiment, this mixture comprises a first component which includes at least one chlorinated species and/or at least one fluorinated species. $SiCl_4$, or $SiF_4$ in particular can be used. The first component has the advantage of etching the modified superficial part 53 of the protective coating 24.

At the same time, one aspect of the invention involves forming a protective film on the exposed surfaces for which etching is not desired, in particular at the horizontal parts corresponding to the exposed surface of the contact module 25 and to the base portion 41 of the cavities 13. In this respect, one aspect of the invention involves playing with the tendency to form a silicon oxide film on materials used for the contact module 25 and for the electrically-insulating area, whereas this formation is much slower, or even non-existent, on the material of the protective coating 24, even when modified (in this context, FIG. 10 does not show any oxide film at the protective coating 24).

For example, under the described plasma application conditions given hereafter, and after the implantation phase under the conditions described hereinabove, a silicon oxide film can be created that is between 3 and 4 times thicker on the contact module (typically having a NiSi base) and on the insulating material of the cavity 13 (typically $SiO_2$) than on the protective coating (typically SiN). According to one embodiment, the application of the plasma is configured such that the oxide film formed on the protective coating has a maximum thickness of 2 nm.

Figure 10:
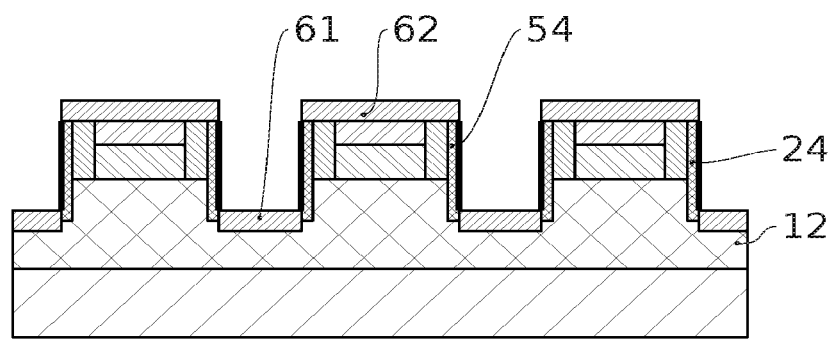
FIG. 10 shows a step of the method following that in FIG. 9 producing an oxide film and partial removal of the protective coating.

Thus, when applying the gas mixture by plasma, a film of a silicon oxide, of the general formula $SiO_x$, will be formed as a priority on the surfaces 52 and 51 shown in FIG. 9. The combined action of the etching of the modified parts of the protective coating 53 and of the formation of a silicon oxide film is shown in FIG. 10. It is noted that a residual part 54 of the protective coating 24 is preserved and that a silicon oxide film 61, 62 is present at the initial location of the protective coating 24. It is understood that the silicon oxide film ensures passivation of the surfaces considered so as to render them insensitive to the etching targeting the protective coating 24.

In one embodiment, the gaseous mixture comprises at least one component including the oxygen species. This is typically dioxygen $O_2$, also used to adjust the dilution of the other components in the mixture.

According to another aspect, the gaseous mixture advantageously comprises a fluorocarbon gas, and more preferably a hydrofluorocarbon gas, of the general formula $C_xH_yF_z$. According to one aspect, this gas enhances the etching action of the modified part of the protective coating 24. It can also be used to etch the residual part of this protective coating, once the modified part has been completely removed.

A detailed example of the application of such a plasma is given hereafter. A reactor corresponding to one of the types mentioned hereinabove for the implantation phase can be used. Preferentially, the implantation step and the plasma application step take place in the same reactor. This is also preferentially the case of the additional implantation and application steps carried out thereafter and described hereinbelow.

In this instance, based on the use of an ICP-type reactor, the following conditions can be implemented:

pressure: between 10 and 80 Millitorr, i.e. between 0.01×
(101325/760)Pa and 0.08×(101325/760)Pa;
temperature: between 10 and 100° C.;
source power: between 100 and 1000 W;
bias voltage: between 50 V and 500 V;
working frequency: 200 Hz to 5 kHz, with an operating cycle for example that lies in the range 20% to 100%;
duration: less than 20 seconds, preferably greater than 5 seconds, and preferably less than or equal to 10 seconds;
gas mixture:
hydrofluorocarbon gas CxHyFz with a flow rate in the range 10 sccm to 500 sccm;
O2 with a flow rate in the range 10 sccm to 1000 sccm;
SiCl4 or SiF4 with a flow rate in the range 5 to 15 sccm.

In light of the result shown in FIG. 10, the lateral extension of the protective coating 24 has been substantially reduced, since only a residual part 54 remains. If the initial film 24 is thin enough relative to the etching conditions, it can be completely removed at this stage.

However, thanks to one preferential aspect of the invention, this removal can be precisely continued by implementing an additional cycle, at least including implantation and plasma application, preferentially using the parameters described hereinabove.

The repetition of these steps allows the protective coating 24 to be gradually removed while preventing a too thick deposition of the silicon oxide on this protective coating, which could occur if a single plasma application step was implemented. More specifically, the additional implantation is advantageously configured so as to etch the silicon oxide film; this etch allows the thickness to be reduced on the horizontal parts and, preferentially, allows the silicon oxide film to be completely removed from the vertical parts, i.e. at the protective coating 24.

The implantation and plasma application times can be adjusted to limit the thicknesses treated.

Figure 11:
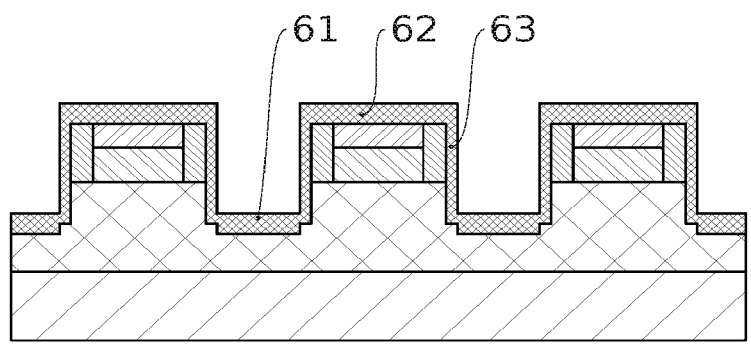
FIG. 11 shows growth of the oxide film taking place in a preferential manner on the horizontal parts.

FIG. 11 shows the result of an additional implantation for forming new modified parts, including a new modified part at the protective coating and an additional application of a plasma. In this example, no residual, unmodified part of the protective coating 24 remains; this means that, during the additional plasma application step, the entire protective coating was removed. In this case, for the example, an oxide film 63 has been shown on the vertical parts.

The figures show the implementation of a single additional implantation and plasma etching cycle. However, this example of this principle is not limiting and a plurality of cycles can be carried out to gradually consume the protective coating 24.

Figure 12:
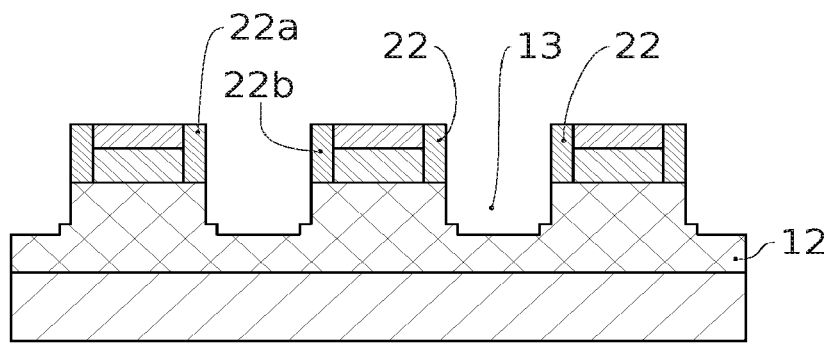
FIG. 12 shows one possible configuration of the electrically-insulating area before the deposition of the mechanically stressing layer.

FIG. 12 shows the result after at least one additional implantation and at least one additional plasma application, and after a final cleaning step. This step is configured so as to remove the silicon oxide film that may remain, in particular at the surfaces of the base portion of the cavity 13 and of the top face of the contact module 25, as was the case in FIG. 11 denoted by the reference numerals 61 and 62.

In this context, one embodiment consists of carrying out wet etching, for example using hydrofluoric acid. Preferably, the etching solution is significantly diluted so as to remove the silicon oxide that was deposited, without etching or while etching as little as possible the underlying films, and in particular the material of the electrically-insulating area 12.

The result reflected in FIG. 12 is a succession of transistors between which the distances between the spacers 22 of different transistors have been increased, without hollowing out the cavities 13, such that the aspect ratio obtained in this location is reduced and is much more favourable in the subsequent steps, and in particular in the step of forming a mechanically stressing layer. The formation of voids is significantly reduced or even completely eliminated.

The deposition of the stress liner (i.e. the mechanically stressing layer) can then take place (not shown) while limiting the appearance of residual voids.

Typically, the stress liner is a nitride film, in particular a silicon nitride film (SiN or SixNy, x and y being integers).

It can be deposited in a conformal manner by one of the following techniques:
plasma-enhanced chemical vapour deposition (PECVD), low pressure chemical vapour deposition (LPCVD), rapid thermal CVD (RTCVD), physical vapour deposition (PVD), or atomic layer deposition (ALD). Other deposition types can be considered.

The stress liner can have a thickness from several nanometres to several tens of nanometres, and in particular a thickness that lies in the range 5 to 40 nanometres, for example 20 nm.

This does not rule out the deposition of a plurality of stress liners or limiting the deposition of the stress liner to an area of the face of the substrate, and, optionally, coating at least one other area of the face of the substrate with at least one other stress liner, for example to implement mechanical stresses of opposite signs (compressive and tensile stresses).

One interest of the invention is to increase the reliability of transistor manufacturing operations.

The subsequent steps of forming the electrical contacts on the electrically-active areas of the transistors (source/drain areas and gate) can in particular take place without the risk of causing a short-circuit between two active areas 11 linked to an unwanted filling of a residual void at the STI areas 12.

The invention claimed is:

1. A method for producing a component, a base of which is formed by a plurality of transistors, on a substrate comprising an active area and an electrically-insulating area, each transistor of the plurality of transistors comprising a gate, spacers on the sidewalls of the gate, and a contact module on a top face of the gate, the electrically-insulating area comprising at least one concave-shaped cavity between a spacer of a first transistor of the plurality of transistors and a spacer of a second transistor of the plurality of transistors, the first transistor and the second transistor being adjacent, the method comprising:
    forming a gate area of the transistors;
    forming the spacers;
    forming a protective coating configured to at least partially cover the spacers and a sidewall portion of the at least one concave-shaped cavity, without covering a top face of the gate area and a base portion of the at least one concave-shaped cavity;
    forming the contact module in a top portion of the gate area from a top face thereof, the gate being disposed in a portion of the gate area lying beneath the contact module; and
    removing, after the contact module has been formed, at least one part of the protective coating, with:
        an isotropic light-ion implantation configured to form modified superficial parts in a thickness, respectively, of the contact module, of the protective coating, and of the base portion of the at least one concave-shaped cavity, and
        an application of a plasma comprising at least one mixture of gaseous components, the application of a plasma being configured to:

etch the modified superficial parts of the protective coating so as to only preserve, in the protective coating, a residual part of the protective coating, and form a silicon oxide-based film on exposed surfaces, respectively, of the contact module, of the at least one concave-shaped cavity, and of the protective coating, and so that the silicon oxide-based film is thicker on the exposed surface of the contact module and on that of the at least one concave-shaped cavity than on the exposed surface of the protective coating.

2. The method according to claim 1, further comprising, after the plasma is applied:

an additional isotropic light-ion implantation, configured to remove the silicon oxide-based film from the exposed surface of the protective coating while preserving at least part of a thickness of the silicon oxide-based film on the exposed surface of the contact module and on that of the at least one concave-shaped cavity, and configured to form a new modified superficial part of the exposed surface of the residual part of the protective coating; and an additional application of the plasma, configured to etch the new modified superficial part of the residual part of the protective coating, in a selective manner relative to the modified parts of the silicon oxide-based film, respectively, on the exposed surface of the contact module and on that of the at least one concave-shaped cavity.

3. The method according to claim 2, further comprising at least one additional cycle of performing the additional isotropic light-ion implantation and the additional application of the plasma.

4. The method according to claim 1, wherein the at least one mixture of gaseous components of the plasma comprises at least one first gaseous component and one second gaseous component, wherein the first gaseous component is configured to etch the modified superficial part of the protective coating so as to only preserve, in the protective coating, the residual part of the protective coating, and wherein the second gaseous component is configured to etch at least one part of the residual part of the protective coating.

5. The method according to claim 4, wherein the second gaseous component comprises at least one fluorocarbon species.

6. The method according to claim 5, wherein the at least one fluorocarbon species includes at least one hydrofluorocarbon species.

7. The method according to claim 4, wherein the first gaseous component comprises $SiCl_4$ and/or $SiF_4$.

8. The method according to claim 1, wherein the at least one mixture of gaseous components comprises dioxygen.

9. The method according to claim 1, wherein light ions of the isotropic light-ion implantation comprise species selected from hydrogen-based ions and/or helium-based ions.

10. The method according to claim 9, wherein the isotropic light-ion implantation is performed by applying a plasma comprising the light ions at a pressure of greater than or equal to 100 Millitorr at a temperature of less than or equal to 100° C.

11. The method according to claim 10, wherein a duration of the isotropic light-ion implantation is less than or equal to 30 seconds.

12. The method according to claim 10, wherein a duration of the isotropic light-ion implantation is less than or equal to 10 seconds.

13. The method according to claim 1, wherein the protective coating is made with a silicon nitride base.

14. The method according to claim 2, wherein the isotropic light-ion implantation, the application of the plasma, the additional isotropic light-ion implantation, and the additional application of the plasma are performed in a same reactor.

15. The method according to claim 1, further comprising, after the removing of the at least one part of the protective coating, forming a mechanically stressing layer for the transistors.

16. The method according to claim 15, wherein the removing of the at least one part of the protective coating is configured to entirely remove the protective coating before the forming of the mechanically stressing layer.

17. The method according to claim 15, further comprising, after the removing of the at least one part of the protective coating and before the forming of the mechanically stressing layer, performing an etching configured to remove the silicon oxide-based film.

* * * * *